United States Patent [19]

Kikuchi

[11] 4,151,599
[45] Apr. 24, 1979

[54] MAGNETIC BUBBLE DISPLAY UNITS
[75] Inventor: Yoshiki Kikuchi, Ebina, Japan
[73] Assignee: Fuji Xerox Co., Ltd., Tokyo, Japan
[21] Appl. No.: 884,666
[22] Filed: Mar. 8, 1978
[30] Foreign Application Priority Data Mar. 22, 1977 [JP] Japan ................................ 52-30473
Oct. 14, 1977 [JP] Japan ............................... 52-122323

[51] Int. Cl.² .......................................... G11C 19/08
[52] U.S. Cl. ....................................... 365/3; 365/29;
365/36; 365/41
[58] Field of Search ...................... 365/2, 3, 29, 36, 41

[56] References Cited
U.S. PATENT DOCUMENTS 3,902,166  8/1975  Kiyasu et al. .......................... 365/41
4,054,866  10/1977  Kikuchi .................................... 365/3

Primary Examiner—James W. Moffitt
Attorney, Agent, or Firm—Cushman, Darby & Cushman

[57] ABSTRACT

In a display unit utilizing magnetic bubbles, selective extinction of the magnetic bubbles in a matrix results in a pattern of letters and/or images which are combinations of the magnetic bubbles as picture elements. The present display unit has in-plane anisotropic areas each of which has an easy magnetization axis parallel to the surface of the magnetic bubble material thin film produced by attaching the magnetically soft thin film on the magnetic bubble accommodation spaces in the magnetic bubble material thin film or by ion-implanting into the given spaces of the magnetic bubble material garnet. Therefore, according to this invention, the domain walls of the magnetic bubbles are attracted to said in-plane anisotropic areas and securely held at predetermined picture element positions. And the additional in-plane anisotropic areas may be formed at desired locations where the domain walls of the expanded magnetic bubbles should exist, or locations extending from the bubble collapse diameter to the expanded diameter. This makes possible to obtain expanded magnetic bubbles on picture display, and hence minimize the ratio of the mutual distance of the bubbles to the bubble diameter, improving the quality of the picture displayed.

9 Claims, 16 Drawing Figures

MAGNETIC BUBBLE DISPLAY UNITS

RELATED APPLICATION

This application is related to U.S. Pat. No. 4,054,866 issued on Oct. 18, 1977.

FIELD OF THE INVENTION

This invention relates to a display unit utilizing magnetic bubbles as the picture element, and more particularly to the magnetic bubble display unit that convert the incoming electric signals representing letters and/or images into magnetic bubble matrix patterns. Moreover this invention relates to the magnetic bubble display unit capable of securely positioning the magnetic bubbles of desired size at picture element positions or bubble accommodation spaces, of the magnetic bubble matrix.

DESCRIPTION OF THE PRIOR ART

The display unit utilizing magnetic bubbles as picture element is written, for example, in said U.S. Pat. No. 4,054,866. Said unit employing magnetic bubble matrix has such disadvantage that the interval between adjacent bubbles can not be smaller than thrice to forth-fold the bubble diameter because of the repulsive force between them, therefore the ratio of the mutual distance to the diameter of the picture element is large and low quality of the image results. Because of the repulsive force, bubbles in peripheral portion of the matrix are moved outward, and in the worst case they touch the electric conductors surrounding each bubble accommodation space. This makes impossible to selectively collapse the bubbles on pattern formation. The deviated bubbles are further moved due to the magnetic field induced by the bubble extinction currents and the destruction of the bubble matrix may result.

SUMMARY OF THE INVENTION

An object of the invention is to provide a magnetic bubble display unit in which the magnetic bubbles are securely held at desired positions in the matrix.

Another object of this invention is to provide the magnetic bubble display unit in which the enlarged diameter of each magnetic bubble, or picture element, leads to the reduction in the ratio of picture element interval to picture element diameter.

Further object of this invention is to provide the magnetic bubble display unit in which the expanded magnetic bubbles are obtained without keeping the current flow in the conductive segments, thereby the ratio of the magnetic bubble interval to the bubble diameter is easily minimized.

Other features and advantages of the invention will be apparent from the following description taken in connection with the accompanying drawings, disclosed preferred embodiments thereof.

DETAILED DESCRIPTION OF THE INVENTION

Figure 1:
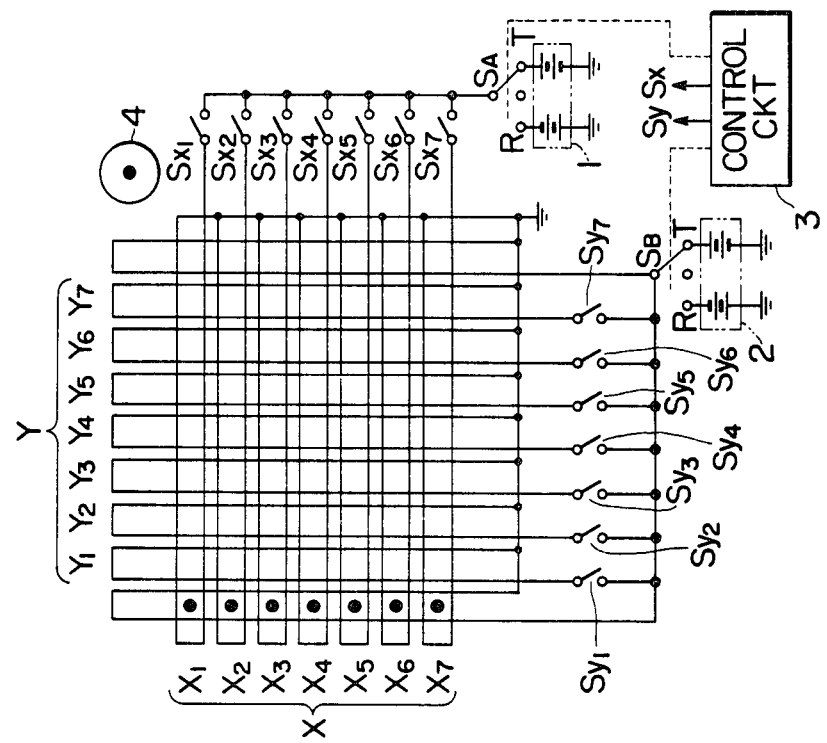
FIG. 1 shows a schematic configuration of the magnetic bubble generator of this invention.

FIG. 1 shows a schematic representation of a magnetic bubble generator of this invention, wherein provided a segment pattern X composed of a number of folded line conductive segments X1-X7 arranged in parallel with each other on a plane of a magnetic thin film (not shown in the figure), and another segment pattern Y composed of similar conductive segments Y1-Y7 parpendicular to said pattern X on a plane of another magnetic thin film (not shown in the figure). Then the patterns X and Y are lapped to form a lattice with those magnetic thin films are between the conductive segments. Instead, the conductive segment patterns X and Y may be placed on the upper and lower surfaces of a magnetic thin film, respectively.

Favorably, said conductive segment patterns X and Y are formed by etching after a metal conductor is painted on such substrate as glass. Said folded conductive segment patterns X and Y consist of many parallel conductive segments X1-X7 and Y1-Y7, each is cyclical having narrow-pitch portion Px1, Py1 and wide-pitch portion Px2, Py2 as shown in the figure. Outward lines of the conductive segments X1-X7 and Y1-Y7 are connected through switches Sx1-Sx7 and Sy1-Sy7 to power sources 1 and 2, respectively. These switches are controlled by a control circuit 3. All return lines of said conductive segments are grounded together. In such magnetic bubble generator, as disclosed in the said U.S. patent, generation and extinction of magnetic bubbles are controlled by X variation in the intensity of the magnetic field owing to variation the current in the conductive segment patterns X and Y. Therefore, it is possible to obtain a magnetic bubble pattern representing desired letters or images by controlling the current in the conductive segment patterns X and Y.

In this specification and the following claims, a magnetic bubble denotes a cylindrical magnetic domain existing under a bias magnetic field exerted in the direction perpendicular to the surface of a thin film of suitable magnetic material such as rare earth orthoferrite plumbite or rare earth iron-garnet.

A method to form magnetic bubble pattern will be expressed in relation with the generator utilizing samarium-terbium mixed orthoferrite ($Sm_{0.55} Tb_{0.45} FeO_3$) as magnetic bubble material. If the $Sm_{0.55} Tb_{0.45} FeO_3$ magnetic thin film is about 50 microns thick and the applied magnetic field is +58 oersteds in the room temperature, each magnetic bubble has a diameter of about 30 microns. The magnetic bubble is stable in the range of the applied magnetic field between +50 Oe which is the field Hs where the bubble expands to the strip domain (strip-out field), and +64 Oe which is the field Hco where the bubble collapses (magnetic bubble collapse field). In this range, the diameter of the magnetic bubble is reduced with increasing magnetic bias field applied.

Figure 2:
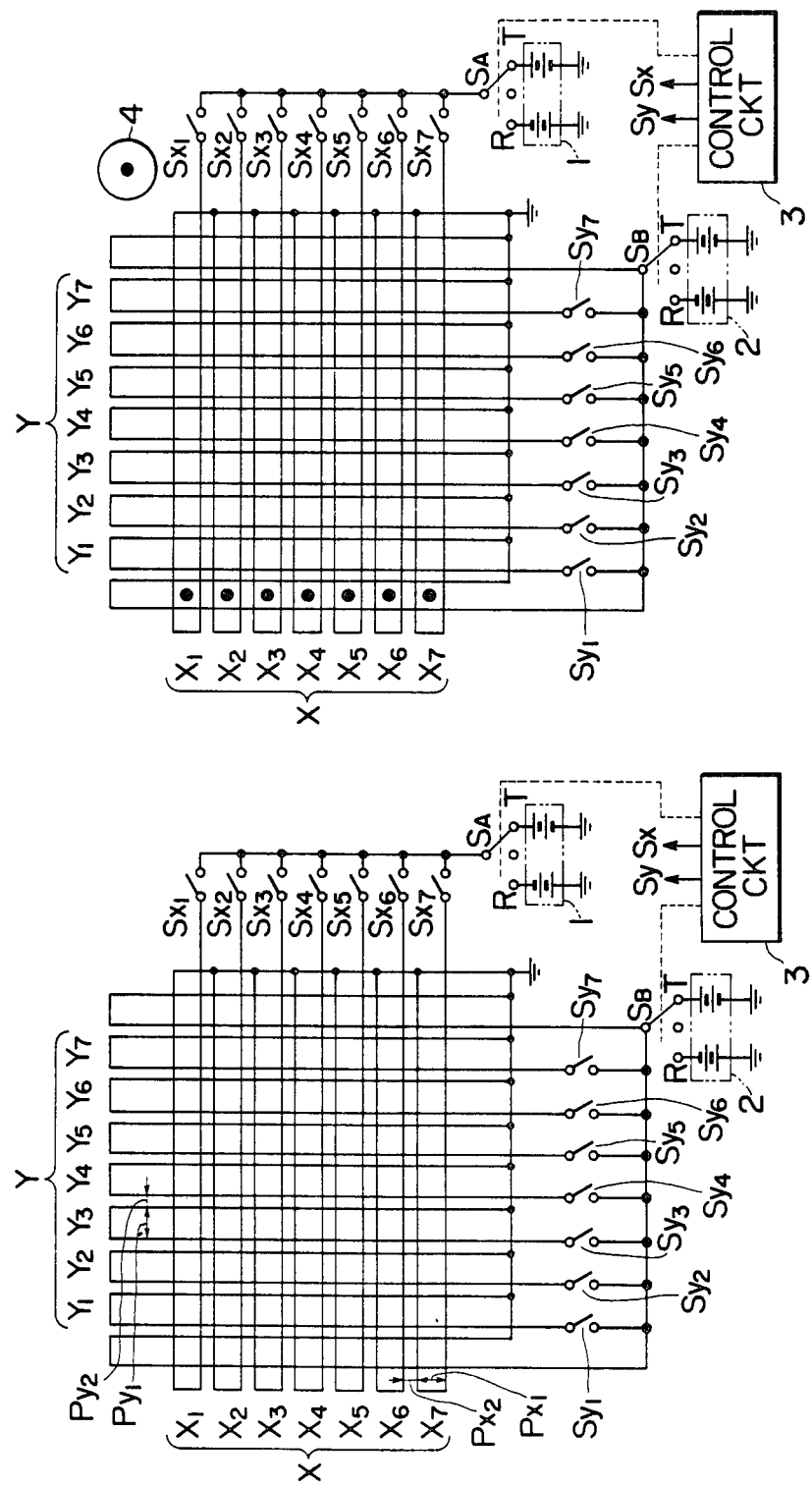
FIG. 2 is a schematic view corresponding to FIG. 1 showing an illustrative setting of seed bubbles.

FIG. 2 shows that seed bubbles are set at given positions by conventional seed bubble generator (not shown in the figure). In this condition, all the switches in groups Sx and Sy are at "OFF" positions, and an external bias field 4 with which magnetic bubbles are stable (e.g. +58 Oe) is applied in the direction perpendicular to the paper sheet and coming upwardly through it.

Figures 3, 4:
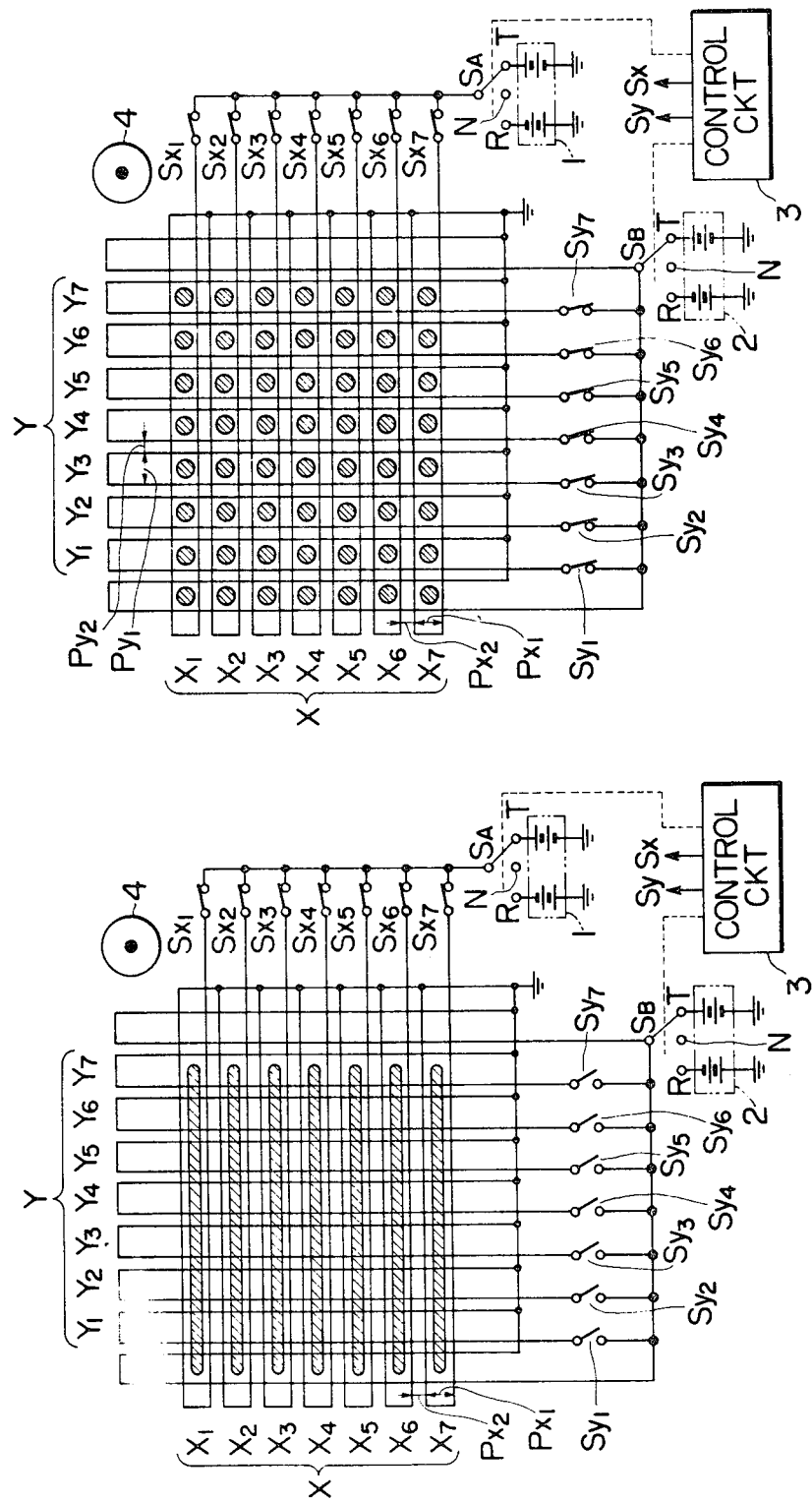
FIG. 3 is a plan view corresponding to FIG. 1 showing an illustrative production of strip domains.
FIG. 4 is a plan view corresponding to FIG. 1 showing insular domains from the strip domains.

In FIG. 3, switches Sx1-Sx7 of the conductive segment patterns X are in "ON" positions, the conductive segments X1-X7 are supplied with the currents from the power source 1, at the wide-pitch portion px1 of each segment a magnetic field is produced in the direction opposite to the external bias field 4, and at the narrow-pitch portion Px2 a magnetic field in the same direction as the external field, therefore the magnetic bubbles are stripped out in the wide-pitch portions. These stripped-out magnetic bubbles are defined as magnetic strip domains. When the conductive segments carry a current of 0.5 amperes, the portion Px1 receives −38 oe (>Hs = 50 Oe) and portion Px2 +94 Oe (>Hco = 64 Oe) of superposed magnetic field.

In FIG. 4, switches Sx1-Sx7 and $Sy_1$-$Sy_7$ of the conductive segment patterns X and Y are in "ON" positions and connected to the power sources 1 and 2 respectively, so that the conductive segments X1-X7 carry 0.5 amperes, and Y1-Y7 0.9 amperes. At each space where the wide-pich portions Px1 and Py1 of both segments are overlapped, a magnetic field of −57 Oe is generated, but because of the external bias field of +58 Oe, the sum of those fields will be nearly equal to zero. At each space where portion Px1 of the segment X and portion Py2 of segment Y are superposed, segment X gives −22 Oe of magnetic field and segment Y +66 Oe, and hence the sum of the two is +44 Oe. The resultant magnetic field is +44 + 58 = +102 Oe. Since the value is larger than the strip domain cut-off field of the material, the strip domains in the portion Px1 such as shown in FIG. 3 are cut off at the portion Py2 of segment Y to provide magnetic insular domains (expanded magnetic bubbles) as shown in FIG. 4. At the areas defined by the portions Px2 of segment X and the portion Py1 of segment Y, the magnetic field caused by segment X can be made opposite in direction and nearly equal in intensity to the field caused by segment Y, and the sum of these fields is very small, the bias field being unaffected.

Figure 5:
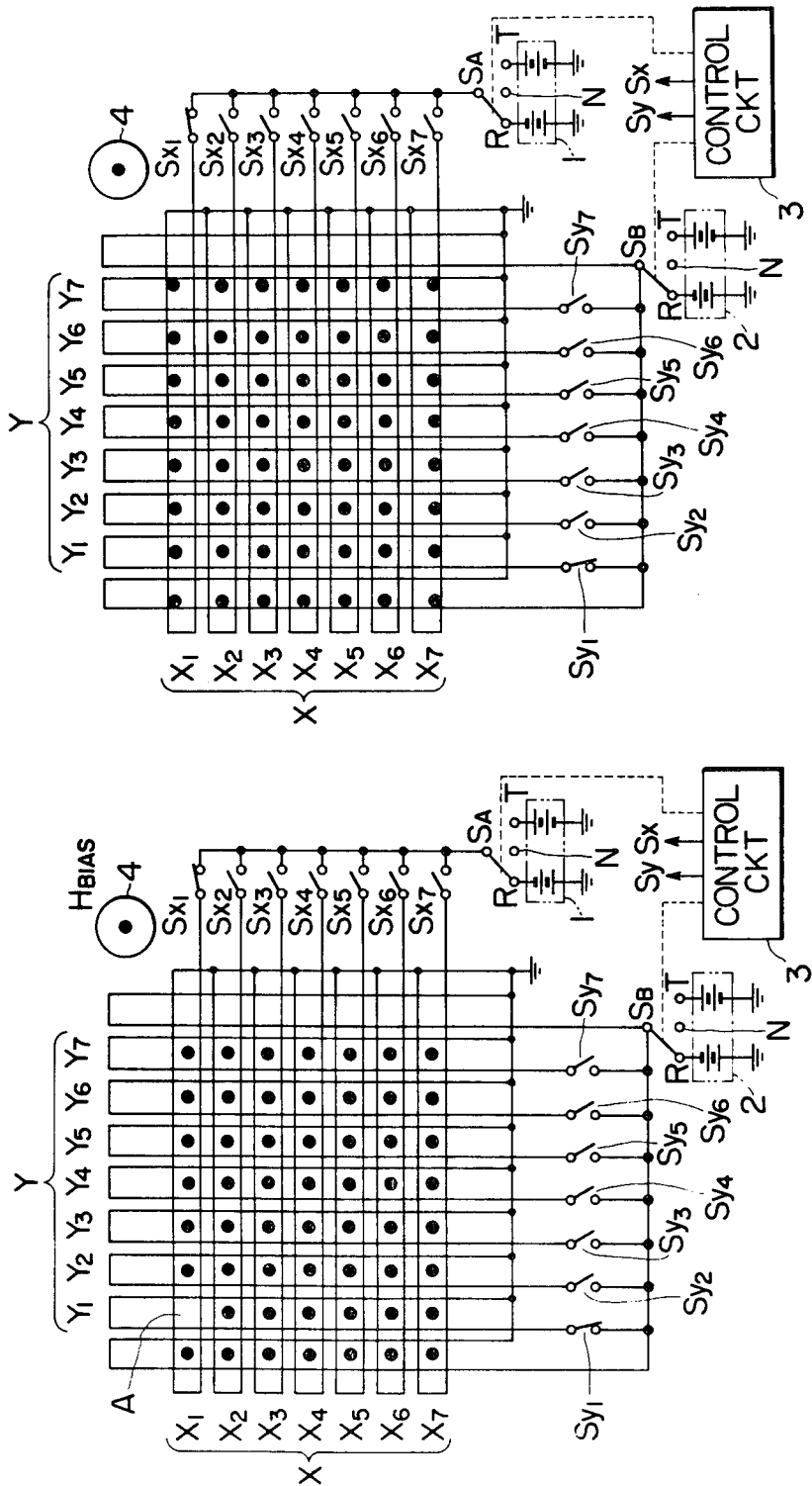
FIG. 5 is a view corresponding to FIG. 1 showing a formation of magnetic bubble pattern.

After the magnetic insular domains are produced in said method, contacts SA and SB are turned to the terminal N in order to block the currents in the conductive segment patterns X and Y and leave only the bias field. Each magnetic insular domain in FIG. 4, then, decreases in size and a stabilized magnetic bubble latice is settled. Next, the magnetic bubbles in the matrix are selectively collapsed to make a magnetic bubble pattern indicating given letters or pictures. To extinguish a bubble, a current must be fed to the conductive segment patterns surrounding the bubble so that a magnetic field, the direction of which is opposite to that employed for formation of the magnetic bubble matrix, is induced. FIG. 5 shows the switch positions for extinguishing a magnetic bubble in the area denoted by A, both switches SA and SB are connected to the contacts R and only switches Sx1 and Sy1 are closed. As the $Sm_{0.55} Tb_{0.45} FeO_3$ has a magnetic bubble collapse field of +64 Oe, the resultant field or the sum of the magnetic field generated by the currents in the conductive segments X1 and Y1 and the bias field $H_{BIAS}$ of +58 Oe should be larger than +64 Oe. However, to prevent the magnetic bubbles in the regions other than A from extinguishing, the magnetic field Hcx generated by the current in the conductive segment X1 must satisfy the relation $$Hcx + 58 < 64$$

and the field Hcy in the conductive segment Y1 must satisfy $$Hcy + 58 < 64$$

Furthermore, the Hcx and Hcy must be chosen in such values as to satisfy the relation $$64 < Hcx + Hcy + 58$$

If about 50 milliamperes of currents are supplied to the conductive segments X1 and Y1, the magnetic fields Hcx and Hcy will be +4 Oe and only the bubble in A will be extinguished. This way of magnetic bubble extinction is applied to the desired positions in the matrix to form a magnetic bubble pattern expressing letters or images.

Figure 6:
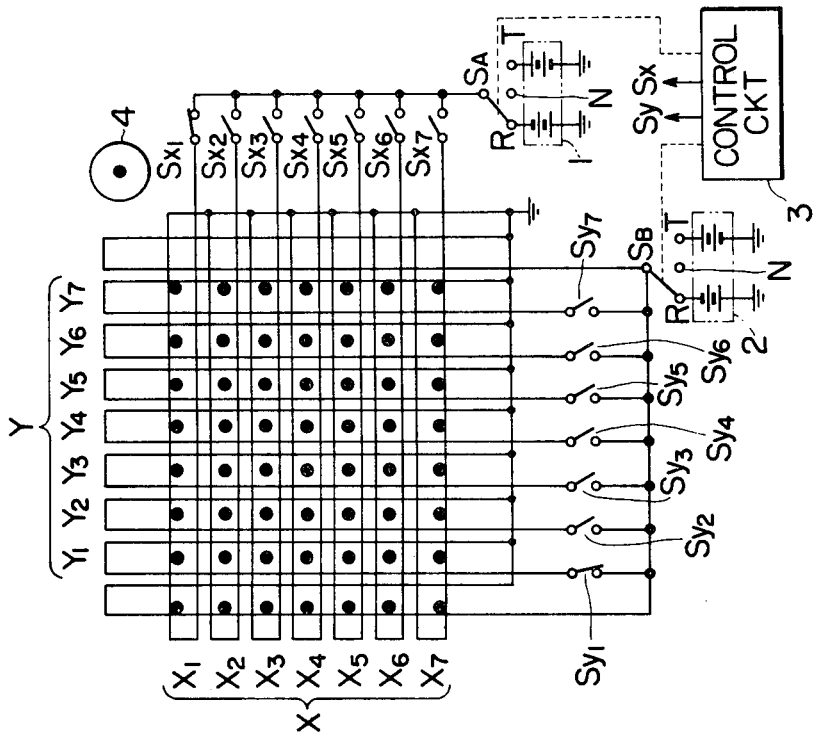
FIG. 6 is a view corresponding to FIG. 5 showing an illustrative pattern with bubbles outwardly expelled.

In the above mentioned magnetic bubble generator, the sums of conductive segment intervals Px1 and Px2 and that of Py1 and Py2 are more than thrice the diameter of the magnetic bubble. The reason is that the magnetic bubbles in the distance less than thrice the diameter of them repulse each others. This is known to be the minimum distance required for stable magnetic bubble image formation. In addition, at the peripheral portion of the matrix, the bubbles in the distance mentioned above will receive repulsive forces from all of the other bubbles in the bubble matrix, so that they will leave the normal lattice positions and touch the conductors as shown in FIG. 6. This disables the subsequent selective extinction of bubbles. And in some cases, the magnetic field established by the current for bubble extinction may increase the amount of deviation of the bubbles and destroy the bubble lattice.

According to this invention, pieces of magnetically soft thin film (e.g., permalloy) are provided around each lattice point of the bubble lattice, or ions are implanted into the same area to make in-plane anisotropic areas each of which has an easy magnetization axis parallel to the surface of the magnetic bubble material thin film, determining the stable locations of bubbles in the lattice. It is known that a magnetic pole attracting the magnetic bubble is built up when the magnetic bubble is generated at the location mentioned immediately above. According to this invention, this phenomenon is applied to secure the magnetic bubble at the location where the wide-pitch portions Px1 and Py1 of the conductive segments are overlapped.

Figure 7:
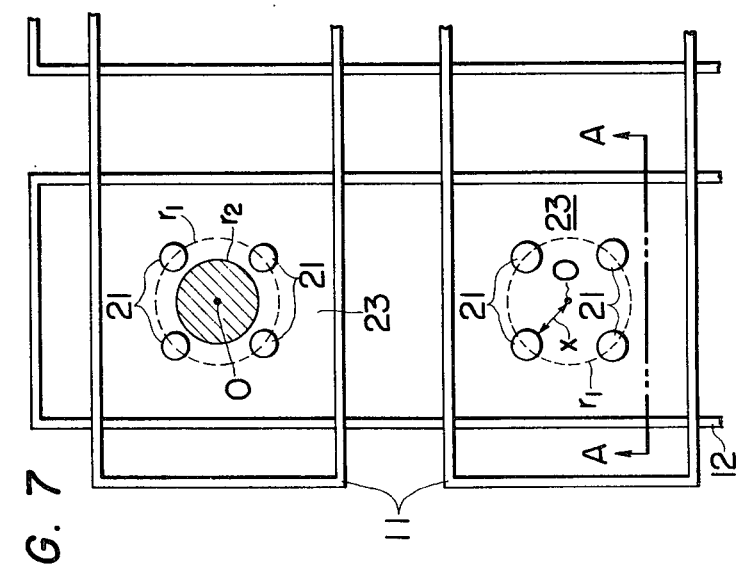
FIG. 7 is a partly expanded plane view of a first embodiment of this invention.
Figure 8:
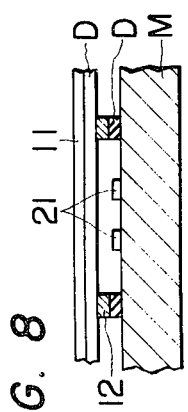
FIG. 8 is a cross sectional view taken on line A—A of FIG. 7.

FIG. 7 is a partly expanded plane view of an embodiment of this invention wherein magnetically soft material is used. FIG. 8 is a cross sectional view along the line A—A of FIG. 7. In the space 23 where wide-pitch portions of X-Y conductive segment patterns 11 and 12 are overlapped, or the space where a magnetic bubble is supposed to exist, a plurality of small circles 21 magnetically soft thin film such as permalloy (80Ni-20Fe) are provided. In FIG. 8, M is the thin film of magnetic bubble material, and D is the insulating material. The small circles 21 are located at equal distance on the circumference $r_1$ with its center at 0, or the center of the space 23. These small circles serve to stabilize the magnetic bubble position when the magnetic bubble matrix is built up, and when the electric image signals are converted to magnetic bubble patterns. That is, in those cases, the magnetic bubble is stabilized in size and shape in such manner that the domain wall portion of the magnetic bubble is linked with the small circles. Namely, the mganetic bubbles at the peripheral portion of the bubble matrix can also be stable because of the attractive force by said magnetically soft thin film pieces 21.

Now the discussion will be made on the optimum position where said magnetically soft thin film is placed.

Figure 9:
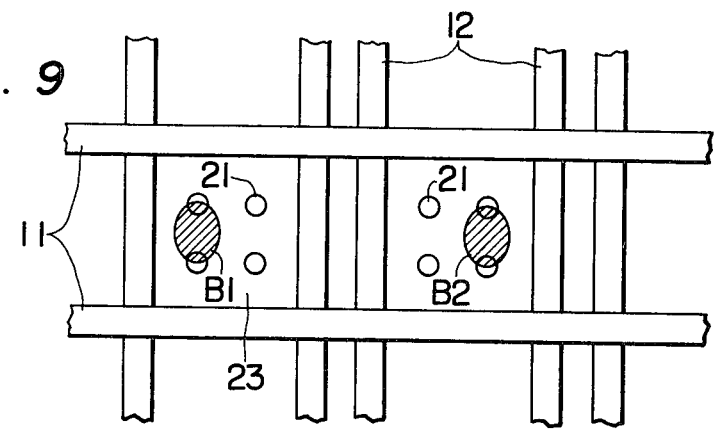
FIG. 9 and FIG. 10 are views corresponding to FIG. 7, showing the disadvantage of the first embodiment of this invention.

Since the currents, which flow in conductive segments X and Y for selective extinction of the magnetic bubbles in the matrix, induce the magnetic field as strong as nearly equal to the extinction field at other magnetic bubbles not to be erased, the said other magnetic bubbles will shrink. The size of the bubble continuously decrease with the increase of the magnetic field applied thereto till the bubble suddenly disappears when it has a "bubble extinction diameter". To secure the bubble at a desired position, a diameter of a shrinked bubble must be chosen at the value that the domain wall of the bubble is in contact with said magnetically soft thin film circles 21. Just after the bubble shrinks to the extent that the domain wall can not touch with all the small circles 21 as shown by $r_2$ in FIG. 7, the bubble is attracted to some of the four circles as shown in FIG. 9 and becomes stable at such positions as B1 and B2. In this condition, when the currents in the conductive segments 11 and 12 are cut off, and the bubbles expand again, then some of the bubbles may be lapped over the conductive segment 11 (or 12) for example as shown by B1' in FIG. 10 as they expand.

After the bubble matrix of FIG. 4 is established, selective extinction of bubbles follows. In the beginning, in FIG. 5, a current is fed to the conductive segment x1 to reduce the size of the bubbles in the segment. In this step, improper magnetic field applied, distance 'a' between the small circles 21 and the diameters 'd' of them will result in bubble stability as shown in FIG. 9. Next, current pulse representing a letter or an image information is selectively supplied to the conductive segment Y1, of FIG. 5, for example, for selective extinction of bubbles. Some of the bubbles abnormally stabilized as shown in FIG. 9 remain existing, and expand again when the currents in both X and Y are blocked and become like ones shown in FIG. 10. Once this condition takes place, in the subsequent selective extinction of bubbles enclosed by segments X2-X7, bubbles may be shifted by the current in either of segments X2-X7 or segments Y1-Y7, and the bubble lattice may be destroyed as described herein before. The distance 'a' between the small circles and the diameter 'd' of the small circle must be chosen at such values that the magnetic field induced by the current in the segments X1-X7 causes the bubbles to shrink with its domain wall kept in contact with said four dots, or circles 21.

In my experiment I adopted yttrium-orthoferrite, and determined the component values as follows; the wide-pitch portion Px1 of conductive segment X was 220 microns, narrow-pitch portion Px2 was 80 microns, the current in the conductive segment X was 150 milliamperes. When the distance between the small circles was chosen to be 90 microns and their diameters about 50 microns, the state of FIG. 10 was observed, but when the distance was 80 microns and the diameter 50 microns, the state was not observed. That means, in case of yttrium-orthoferrite, the extinction diameter of bubble is about 66 microns if the magnetic thin film is about 80 microns thick, therefore the distance between the center 0 of space 23 and the circumference of the small circle 21 must be less than 33 microns.

Figure 11:
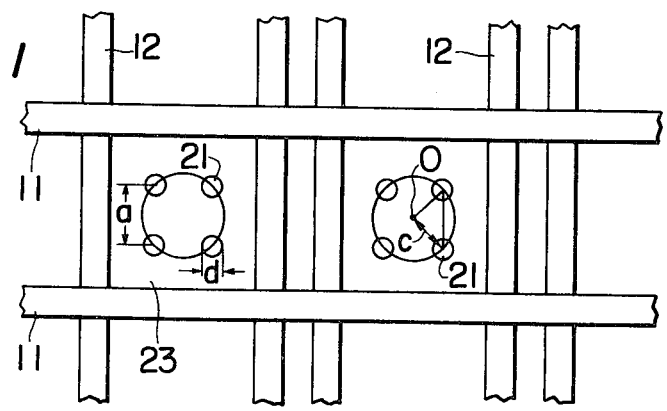
FIG. 11 is a view corresponding to FIG. 9 showing the principle of this invention.

If 'a' is 90 microns and 'd' is 50 microns, the distance c between the center 0 and the circumference of the small circle 21 in the arrangement of FIG. 11 can be calculated by $$c = (a\sqrt{2}) - (d/2) = (90\sqrt{2}) - (50/2) \approx 38'6 am$$

Figure 10:
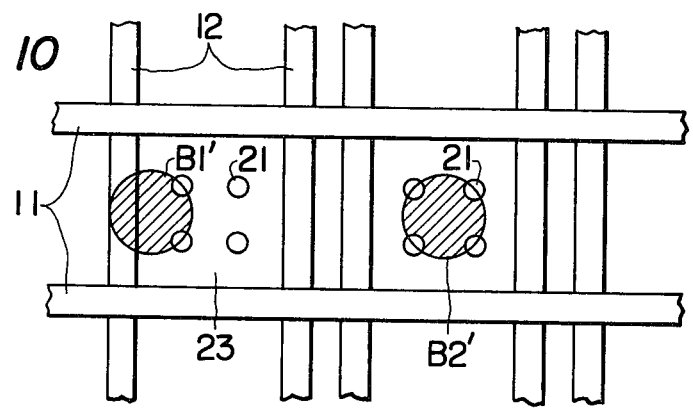

It is difficult for the bubble to shrink while kept in contact with four small circles. This is the reason why the condition of FIG. 10 is ready to occur. As was mentioned above, the arrangement pattern of the magnetically soft thin film small circles is restricted in size, but the size is easily obtained by determining the relation between the bubble diameter employed and the magnetic field established by the current in the conductive segment X and/or Y.

According to this invention it is possible to securely hold the bubbles at lattice positions of the magnetic bubble matrix, and to display the correct image without distortion. However as mentioned hereinbefore it has such disadvantage that restriction on the magnetic bubble interval of 3-4 times as large as the bubble diameter leads to a large distance between the picture elements on the display, deteriorating the image quality. To improve that disadvantage, the bubble diameter should be increased as much as possible while the bubble mutual distance is kept unchanged. To meet the requirement in this embodiment apparatus, the conductive segments X and Y must continue to carry currents during the image formation, and provide a magnetic field in the direction that the magnetic bubbles in the matrix expand. Assume that $Sm_{0.05}Tb_{0.45}FeO_3$ thin film is employed with wide-pitch portion Px1 and Py1 of 60 microns and narrow-pitch portions Px2 and Py2 of 30 microns, and currents of 40 milliamperes are supplied to the conductive segments X and Y to generate the magnetic field of $-6$ Oe in the direction opposite to the bias field, then the diameter expands from 30 microns under null current to about 50 microns.

However, in that case, heating of the conductive segments causes deterioration of themselves and breakage of the glass substrate supporting the segments, so that disconnection of the segments will result. It is well known, as described hereinbefore, that a magnetically soft material in or on the magnetic bubble material thin film is magnetized by the magnetic field of a magnetic bubble generated at the position, yielding a magnetic pole to attract the bubbles. The second embodiment of this invention is utilizing such phenomenon to stabilize the expanded magnetic bubbles.

Figure 12:
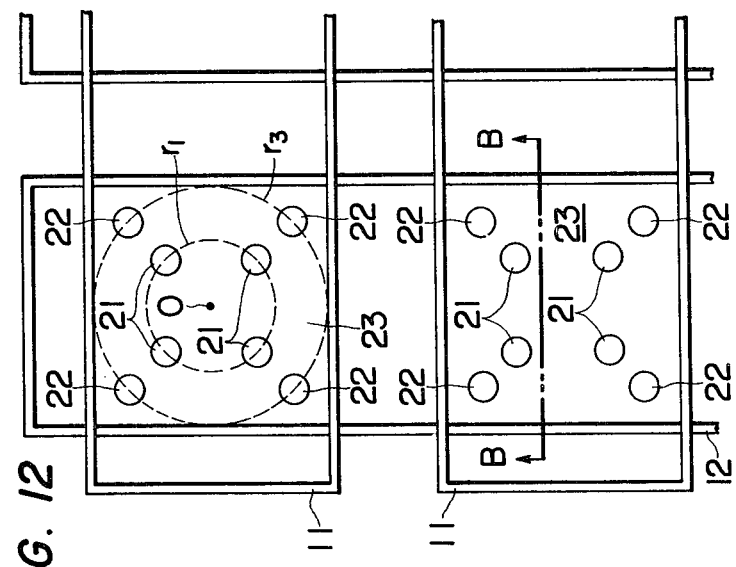
FIG. 12 is a partly expanded view showing a second embodiment of this invention.
Figure 13:
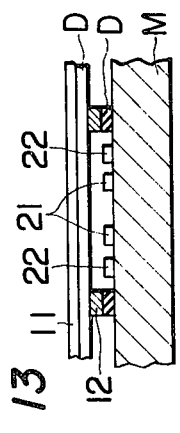
FIG. 13 is a cross section view taken on line B—B of FIG. 12.

FIG. 12 is a partly expanded plane view of the second embodiment of this invention, and the cross section along a line B—B is shown in FIG. 13. In the magnetic bubble accommodation space 23 defined with overlap of wide-pitch portions of X and Y conductive segment patterns 11 and 12 two sets of small circles 21 and 22 of magnetically soft thin film such as permalloy (80Ni-20Fe) are located on circumferences $r_1$ and $r_3$ respectively, with equal intervals. The small circles 21 corresponding to the small circles in the first embodiment, are arranged on the circumference $r_1$ with the same condition and in the same size as described hereinbefore, and function equivalently. The small circles 22 are arranged on the circumference $r_3$ of a larger concentric circle. Preferably, those small circles 21 and 22 are placed on radial lines as shown in the figure, but not confined to this example. It is not always necessary that the small circles 21 and 22 are positioned on the circumferences $r_1$ and $r_3$. The small circles 22 serve to secure the position of the domain wall of the bubble, or the size, shape and position of the magnetic bubble when a current is fed to the conductive segment to expand the size of the magnetic bubble after formation of bubble pattern expressing a letter or an image.

Figure 14:
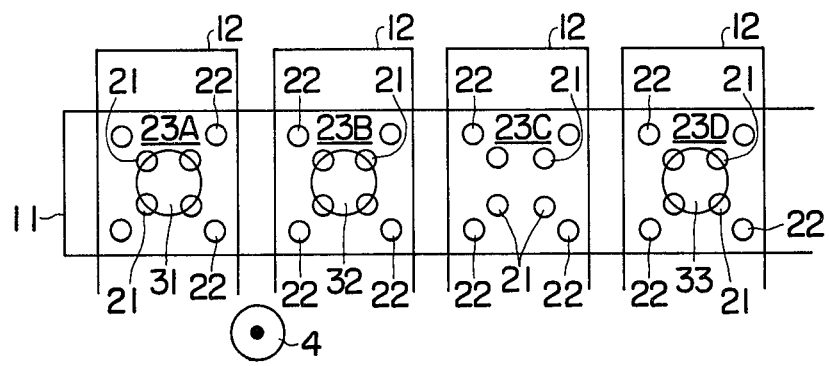
FIG. 14 is a partly expanded plane view showing a part of a magnetic bubble pattern in the second embodiment.
Figure 15:
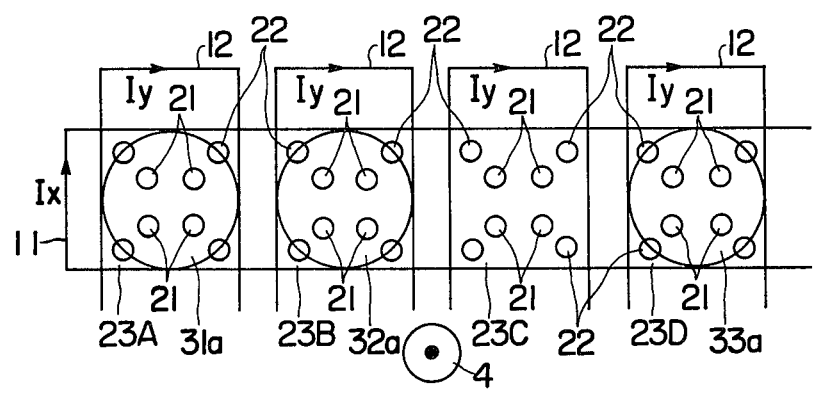
FIG. 15 is a view corresponding to FIG. 14 showing expanded magnetic bubbles in the second embodiment.

FIG. 14 is a partly expanded view of an example of bubble arrangement after a magnetic bubble pattern was formed. Magnetic bubbles constituting a part of the pattern exist in the spaces 23A, 23B and 23D, but not in the space 23C. Each magnetic bubble is stable in the condition that the domain wall portion is overlapped with the small circles 21. Starting from this condition, as shown in FIG. 15, the currents Ix and Iy in the conductive segments 11 and 12 weaken the resultant magnetic field in the domains 23A to 23D, permitting magnetic bubbles 31 to 33 (in FIG. 14) to expand to such size that the domain wall of each expanded magnetic bubble 31a, 32a or 33a is linked with corresponding small circle 22 located on the external circumference $r_3$. Later, the currents Ix and Iy are cut off and the external bias field 4 is reduced to the value that the bubble diameter is in contact with the small circles 22. Thus, each bubble 31a, 32a or 33a is linked with the small circles 22 and held there securely. As mentioned above, according to this invention, each bubble can expands while the distance between the bubbles remains unchanged, therefore the ratio of the mutual distance to the diameter of the bubble can be minimized. The inventor confirmed that the position and shape of each bubble is stable even if the ratio is decreased to less than 2.

An example of numerical values will be given in below in relation with said second embodiment. The permalloy small circles 21 were placed at right angle with each other on the internal circumference $r_1$ with its diameter of 30 microns. The permalloy small circles 22 were located with similar interval on the external circumference $r_3$ with its diameter of 50 microns. The diameter of said small circle 21, 22 was about 10 microns. The bubble pattern obtained becomes stable in the condition the bubble is linked with small circles 21 as shown in FIG. 14. When a current of about 40 milliamperes was fed to the X-Y conductive segments 11 and 12 in the direction that the magnetic bubble lattice was built up, the bubbles 31 to 33 in the spaces 23 expanded. after expansion, the current was blocked, and the bias field was reduced to about 53 Oe, then said expanded magnetic bubbles 31a to 33a linked with the external small circles 22 to become stable.

Figure 16:
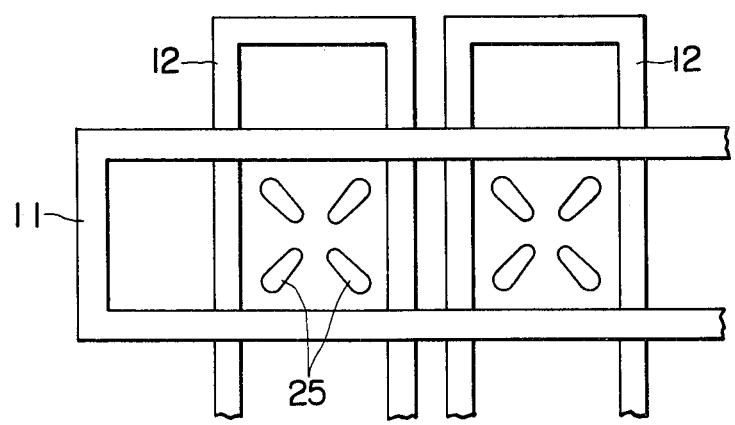
FIG. 16 is a partly expanded plane view showing a third embodiment of this embodiment.

In the above embodiment, individually separated small circles 21 and 22 are provided to position the domain wall portion of each magnetic bubble, but the same effect will be obtained by the use of oblong magnetically soft pieces 25 resulted from combination of every pair of small circles 21 and 22, as shown in FIG. 16. In the embodiment of FIGS. 14 and 15, the currents Ix and Iy must be supplied to the conductive segments to release each bubble from the contact with small circles 21 as the bubble expands from the size in which it is linked with the small circles 21 on the internal circumference $r_1$ to the size in which it is linked with the small cicles 22 on the external circumference $r_3$. In the configuration each pair of small circles 21 and 22 are combined as shown in FIG. 16, no current is required in the conductive segments X and Y, but only the reduction of bias field is enogh for bubble expansion purpose. A regulation of bias field permits continuous variation in size of the magnetic bubble.

As is obvious from the discussion above, according to this invention, not only the bubble position is securely stabilized in the space, but the expansion of bubble diameter for the purpose of decreasing the ratio of the mutual distance to the diameter of each magnetic bubble needs no currents kept flowing in the conductive segments. The results are that the quality of a reproduced picture or a letter can be improved, the conductive segments are free from heating and prevented from deterioration, and the conductive segment supporting substrate is protected against damage.

In the said each embodiment of this invention, explanation was made on the magnetically soft thin film pattern composed of four circular dots, but any other shape is available and the number of the circles is not confined to four. Besides ion implantation technique can be utilized to form in-plane anisotropic area which has an easy magnetization axis parallel to the surface of the magnetic bubble material thin film. Namely, if a magnetic garnet is chosen as the magnetic bubble material thin film, the same effect as described above will be obtained by implantation of such ion as hydrogen, helium or proton into the surface of the garnet in such manner as to form a pattern equivalent in shape and size to the magnetically soft thin film (e.g., parmalloy). Then if necessary, the garnet surface may be etched except the ion implantation area. The depth of etching is preferably equal to the ion implantation depth. Whereas magnetically soft material such as permalloy is opaque, ion implantation areas are transparent. Therefore, they do not mask the bubbles or picture elements and a very clear bubble pattern is established.

What we claim is:
1. A magnetic bubble display unit comprising:
a first set of many folded conductive segments having outward and return lines arranged in parallel with each other in one direction, forming wide-pitch portions and narrow-pitch portions cyclically,
a second set of many folded conductive segments having outward and return lines arranged in parallel with each other in another direction, forming wide-pitch portions and narrow-pitch portions cyclically;
a magnetic bubble material thin film magnetically coupled with said first and second folded conductive segments, a magnetic bias field generator for holding the magnetic bubbles, and a set of in-plane anisotropic areas in each of magnetic bubble accommodation spaces defined by overlapped wide-pitch portions of said first and second folded conductive segments, wherein a size of a loop having such shape as to pass through all said in-plane anisotropic areas at the edges nearest to the center of the magnetic bubble accommodation space is not larger than that of the magnetic bubble just before extinguishing.

2. A magnetic bubble display unit according to claim 1 wherein the in-plane anisotropic areas are formed by attaching magnetically soft thin film pieces on the surface of magnetic bubble material thin film.

3. A magnetic bubble display unit according to claim 1 wherein the in-plane anistropic areas are formed by inplantation of ions into the surface of the magnetic bubble material garnet.

4. A magnetic bubble display unit according to claim 1 wherein, furthermore, a size of another loop having such shape as to pass through all said in-plane anisotropic areas at the edges opposite to the center of the magnetic bubble accommodation space is not smaller than that of the domain wall of expanded magnetic bubble.

5. A magnetic bubble display unit according to claim 4 wherein the in-plane anisotropic areas are formed by attaching magnetically soft thin film pieces on the surface of magnetic bubble material thin film.

6. A magnetic bubble display unit according to claim 4 wherein the in-plane anisotropic areas are formed by implantation of ions into the surface of the magnetic bubble material garnet.

7. A magnetic bubble display unit according to claim 1 further comprising: another set of in-plane anisotropic areas formed in the magnetic bubble accommodation spaces, so as to surround the loop passing through the said set of in-plane anisotropic areas and to link with the domain wall of the expanded magnetic bubble.

8. A magnetic bubble display unit according to claim 7 wherein the in-plane anisotropic areas are formed by attaching magnetically soft thin film pieces on the surface of magnetic bubble material thin film.

9. A magnetic bubble display unit according to claim 7 wherein the in-plane anisotropic areas are formed by implantation of ions into the surface of the magnetic bubble material garnet.

* * * * *